(12) United States Patent
Conte et al.

(10) Patent No.: US 7,633,805 B2
(45) Date of Patent: Dec. 15, 2009

(54) CIRCUIT AND METHOD FOR GENERATING A REFERENCE VOLTAGE IN MEMORY DEVICES HAVING A NON-VOLATILE CELL MATRIX

(75) Inventors: Antonino Conte, Tremestieri Etneo (IT); Mario Micciche, Agrigento (IT); Gianbattista Lo Giudice, Palermo (IT); Alberto Di Martino, Syracuse (IT); Giampiero Sberno, Acicastello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/941,688

(22) Filed: Nov. 16, 2007

(65) Prior Publication Data

US 2008/0130361 A1   Jun. 5, 2008

(30) Foreign Application Priority Data

Nov. 17, 2006   (IT)   ................. MI2006A2211

(51) Int. Cl.
*G11C 11/34* (2006.01)
(52) U.S. Cl. .................. 365/185.2; 365/185.18; 365/226; 365/189.09
(58) Field of Classification Search ............. 365/185.2, 365/185.18, 226, 189.09
See application file for complete search history.

(56) References Cited

U.S. PATENT DOCUMENTS

| | | | | | |
|---|---|---|---|---|---|
| 5,691,941 | A | * | 11/1997 | Imamiya et al. | 365/185.3 |
| 5,828,601 | A | * | 10/1998 | Hollmer et al. | 365/185.2 |
| 5,835,420 | A | * | 11/1998 | Lee et al. | 365/189.09 |
| 6,069,822 | A | * | 5/2000 | Canegallo et al. | 365/185.22 |
| 6,219,277 | B1 | * | 4/2001 | Devin et al. | 365/185.21 |
| 6,219,290 | B1 | * | 4/2001 | Chang et al. | 365/207 |
| 6,456,527 | B1 | * | 9/2002 | Campardo et al. | 365/185.03 |
| 6,621,742 | B1 | * | 9/2003 | Yamada | 365/185.22 |
| 6,700,819 | B2 | * | 3/2004 | Pascucci | 365/185.21 |
| 7,170,790 | B2 | * | 1/2007 | Demange et al. | 365/185.21 |
| 7,239,553 | B2 | * | 7/2007 | Suitou et al. | 365/185.22 |
| 2004/0228162 | A1 | * | 11/2004 | Pasotti et al. | 365/154 |

* cited by examiner

*Primary Examiner*—Viet Q Nguyen
(74) *Attorney, Agent, or Firm*—Lisa K. Jorgenson; Robert Iannucci; Seed IP Law Group PLLC

(57) ABSTRACT

A generator circuit generates a reference voltage on an output terminal connected to a matrix of non-volatile memory cells and includes a comparator positioned between a common node and the output terminal. The comparator has first and second input terminals and an output terminal suitable for supplying a compared voltage given by comparing first and second voltage values present on the first and second input terminals. The circuit includes a reference cell inserted between the common node and a first voltage reference. Advantageously, the reference cell comprises a floating gate with a contact terminal coupled to a biasing block, having an input terminal connected to the output terminal of the generator circuit and being suitable for periodically biasing the floating gate contact terminal at a biasing voltage of a second voltage reference.

31 Claims, 5 Drawing Sheets

CIRCUIT AND METHOD FOR GENERATING A REFERENCE VOLTAGE IN MEMORY DEVICES HAVING A NON-VOLATILE CELL MATRIX

BACKGROUND

1. Technical Field

The present invention relates to a generator circuit of a reference voltage in memory devices with non-volatile cells matrix.

The invention also relates to a method for generating such a reference voltage in memory devices with a non-volatile cell matrix.

The invention particularly, but not exclusively, relates to a circuit for generating a reference voltage in memory devices of the EEPROM type and the following description is made with reference to this field of application for convenience of explanation only.

2. Description of the Related Art

As it is well known, a memory semiconductor device comprises a plurality of non-volatile memory cells, such as for example EEPROM cells, which are usually integrated on a substrate of semiconductor material and ordered in rows and columns in a cells matrix structure. In such a memory device, the element for the information storage, i.e., the single cell, is a MOS transistor of the floating gate type and the amount of charge contained in such floating gate defines the logic state or level of the corresponding single cell. In particular, the floating gate of each memory cell is electrically insulated from the floating gate of each adjacent cell.

Such memory semiconductor device further comprises suitable circuit blocks integrated on the substrate and connected to the matrix of memory cells for allowing to program, to read and to erase, in a selective way, these cells.

Lately, a remarkable development has been shown by those applications, which require the use of memory devices with matrixes of electrically erasable cells, such as memory cells of the EEPROM type.

In fact, EEPROM cells show the peculiarity of being erased in parallel single word by single word and programmed single bit by single bit, i.e., single cell by single cell. Moreover, these EEPROM memory cells have the peculiarity of providing an extremely reduced current consumption both during the reading operation and during the modification operation (erasing or programming) of the content of the cells themselves.

For these peculiarities, memory devices with EEPROM cells are nowadays widespread in several applications and used for example for the realization of the more and more widely used smart cards.

In particular, the request for more and more compact applications has pushed the research to the reduction of the physical dimensions of the memory devices and in particular of the memory cells of the matrix. The physical dimensions of the cells nowadays reached at the end of the productive process however make it exacting and complex, in particular, the erasing operation of the memory cell, operation requested for bringing the cells back to an original or erased state, i.e., to a condition of a virgin cell through elimination of the electric charges contained in the floating gate region.

In these memory devices with reduced dimensions, for discriminating a programmed state from an erased state of the memory cells, it is known to generate, by means of a suitable voltage generator circuit, a reference voltage which is applied to a gate electrode of the matrix and is used for biasing, at a desired value, the memory cells.

Some known solutions, used for example in matrixes of memory cells of the "Flash" EEPROM type, provide to generate such a reference voltage by using suitable algorithms suitable for defining the value thereof.

These solutions however show some drawbacks, the use of algorithms requiring a greater waste from the viewpoint of the circuit, i.e., occupied area, and also a greater waste from the operative viewpoint. In fact, an additional operation is requested on the matrix cells, called "testing" operation, which implies, in most applications, an excessive lengthening of the erasing times.

Alternatively, it is known to use a generator circuit of a control voltage to be applied to the control gate of the memory cells and commonly indicated as control gate voltage, whose principle scheme is shown in FIG. 1. This circuit 1 comprises one or more reference EEPROM cells suitably biased and suitable for driving at the output a certain number of memory cells of a device connected thereto. The reference cells engaged in the voltage generator circuit 1 are of the UV type, i.e., of the type wherein it is possible to erase—by means of the ultraviolet rays—the electric charges stored in the floating gate region of each cell.

In the schematically shown circuit 1, by simplicity of illustration, a single reference UV cell 2 is highlighted which shows a source terminal 3 connected to a voltage reference V1, in particular a ground Gnd, a drain terminal 4 and a gate terminal 5 connected to an output terminal O1 of the circuit 1.

This circuit 1 also comprises a emulation block 6 of a sense amplifier, substantially a current-voltage converter, which comprises a first input terminal connected to a generator 7 of a reference current Iref and a second input terminal connected to the drain terminal 4 of the reference UV cell 2. The emulation block 6 signals to a buffer 8 placed in cascade thereto that the reference current Iref of the generator 7 and the current generated by the reference UV cell 2 are identical.

The buffer 8, which can be realized for example by an operational amplifier, compares the voltages at the input and if they are identical it supplies the output terminal O1 of the circuit 1 with a reference voltage Vcg.

Suitably, the output terminal O1 of the circuit 1 is connected to the gate electrode of the memory cells of the matrix and the reference voltage Vcg generated on the output terminal O1 of the circuit 1 allows to bias these cells.

Further, the circuit 1 provides a feedback connection between its own output terminal O1 and the gate terminal 5 of the reference UV cell 2 by basing it at the reference voltage Vcg.

The circuit 1 also comprises an output stage comprising a filter capacitor 10, connected between the output terminal O1 and the ground voltage reference V1. In particular, this filter capacitor 10 is suitable for reducing the possible "ripple" voltage at the output terminal O1 of the circuit 1 and for increasing its capacity of driving successive stages connected to the output terminal O1. The filter capacitor 10 is suitably sized on the basis of the number of cells connected to the gate electrode of the matrix.

The known circuit just described, although meeting the aim, is not however exempt from drawbacks. In fact, the filter capacitor 10 of its output stage, for ensuring the reduction of the "ripple" voltage on the output terminal O1, can reach high values occupying an excessive silicon area. For example, in some cases, this capacitor can reach values in the order of some tens of picofarads.

Moreover, for a correct biasing of the memory cells of the matrix during a reading operation, it is necessary that the reference UV cells 2 of the circuit 1 are under the condition of a virgin cell at the end of the relative productive process.

Because of their reduced physical dimensions, current devices use a high dosage of UV rays for bringing the reference UV cells 2 to a virgin condition. This operation thus is particularly exacting, long and expensive and, in some cases, extremely reduced dimensions being present, risks not to be ensured anymore.

BRIEF SUMMARY

One embodiment is a voltage generator circuit able to erase the reference cells used for generating a read reference voltage, bringing them back to the condition of a virgin cell without the use of UV rays and having such structural and functional characteristics as to allow to generate a reference voltage in memory devices overcoming the limits and the drawbacks still affecting the circuits realized according to the prior art.

The circuit uses reference cells having floating gate regions accessible through a contact terminal and discharges them periodically by a suitable biasing block.

One embodiment is a circuit generating a reference voltage on an output terminal connected to a matrix of non-volatile memory cells and comprising:

a converter connected to a first supply reference and having at least one first output terminal connected to a common node and a second output terminal;

a comparator connected to a second supply reference and inserted between said common node and said output terminal of said generator circuit, said comparator having at least one first and second input terminal respectively connected to said first and second output terminal of said converter as well as an output terminal suitable for supplying a compared voltage given by the comparison between a first and a second voltage value present on said first and second input terminal; and at least one reference cell inserted between said common node and a first voltage reference;

wherein said at least one reference cell comprises a contact terminal to one of its floating gate regions connected to a first biasing block, having in turn an input terminal connected to said output terminal of said generator circuit and being suitable for periodically biasing said floating gate contact terminal to a biasing voltage of a second voltage reference.

One embodiment is a method for generating a reference voltage on an output terminal of a generator circuit connected to a matrix of non-volatile memory cells and including a converter, supplied by a first supply reference and connected in cascade to a comparator, in turn supplied by a second supply reference and suitable for generating said compared voltage given by the comparison between a first and a second voltage value supplied by said converter, as well as at least one reference cell inserted between a common node and a first voltage reference, said common node being connected at the input to said comparator. The method includes:

feedback supplying towards a control terminal of said reference cell at least one portion of said compared voltage;

controlling a contact terminal of a floating gate region of said at least one reference cell by a first biasing block; and periodically biasing at a biasing voltage value said contact terminal of the floating gate region of at least one reference cell on the basis of a first initialization signal supplied to said biasing block for discharging possible charges contained in said floating gate region of said reference cell.

The characteristics and the advantages of the present invention will be apparent from the following description of an embodiment thereof given by way of indicative and non limiting example with reference to the annexed drawings.

DETAILED DESCRIPTION

Figure 1:
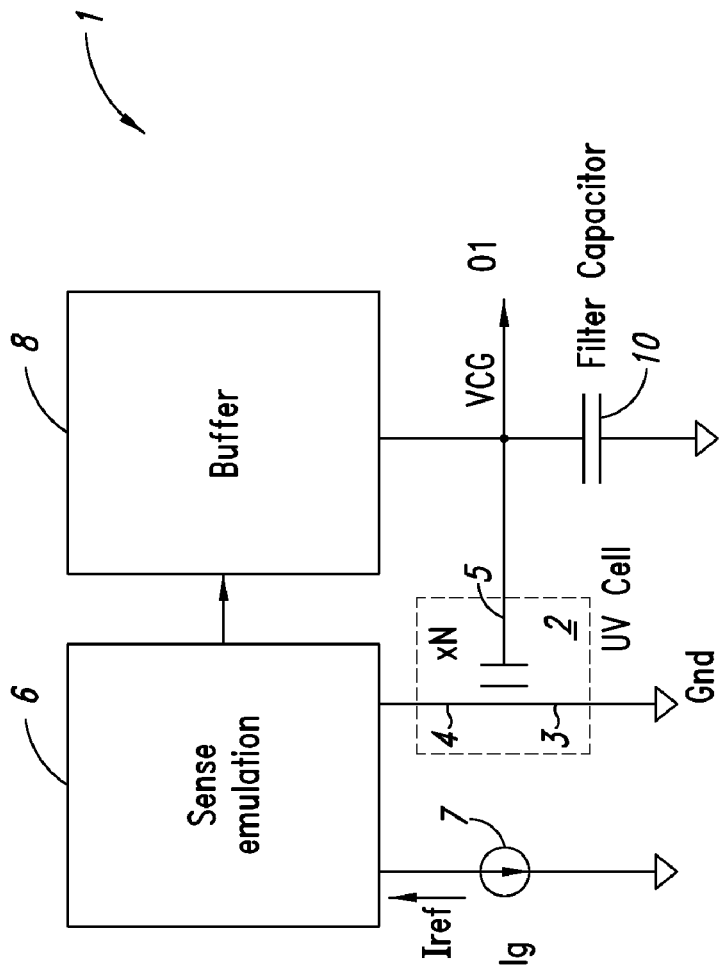
FIG. 1 shows a generator circuit of a reference voltage of the known type.
Figure 2:
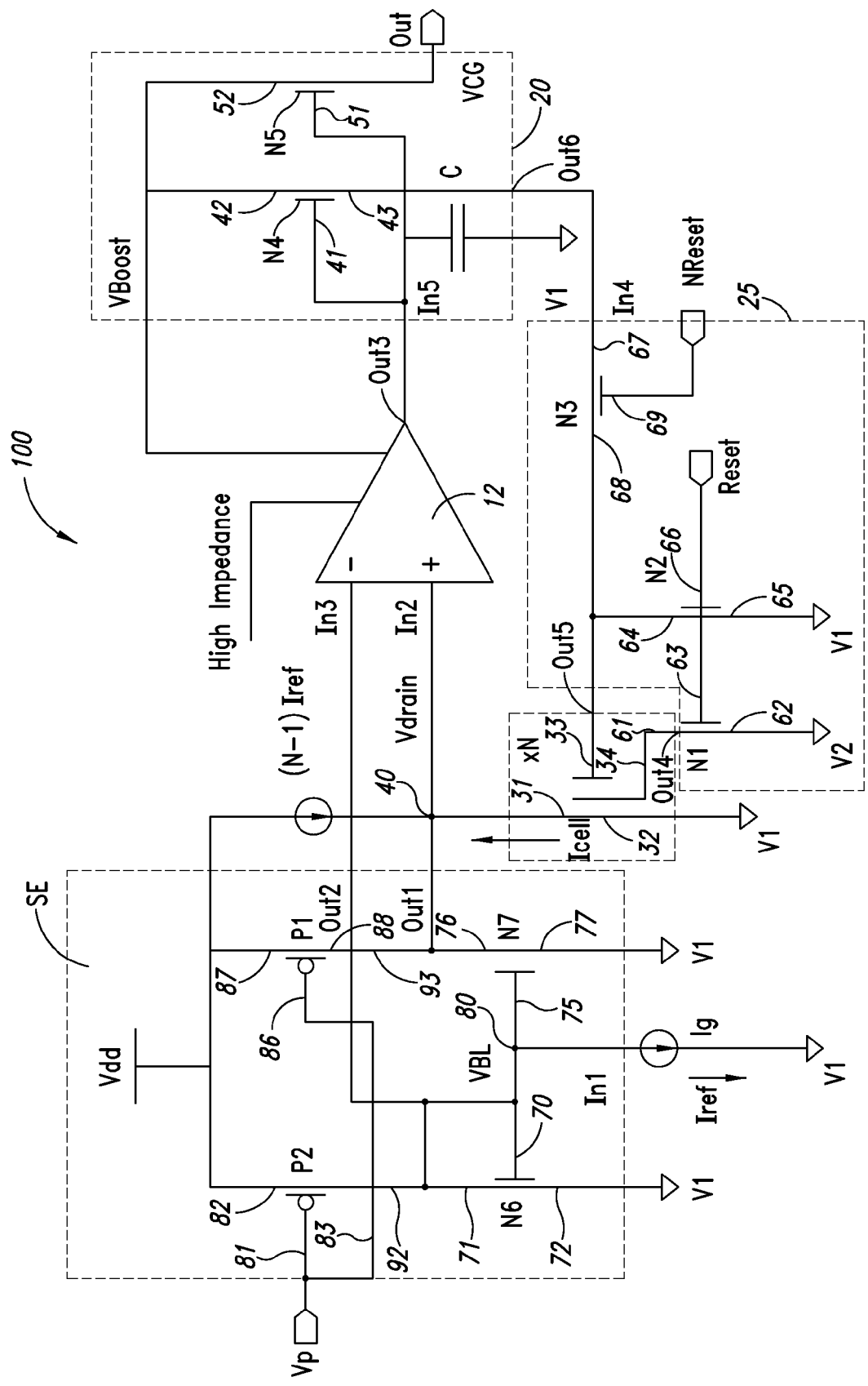
FIG. 2 shows a generator circuit of a reference voltage realized according to one embodiment.
Figure 5:
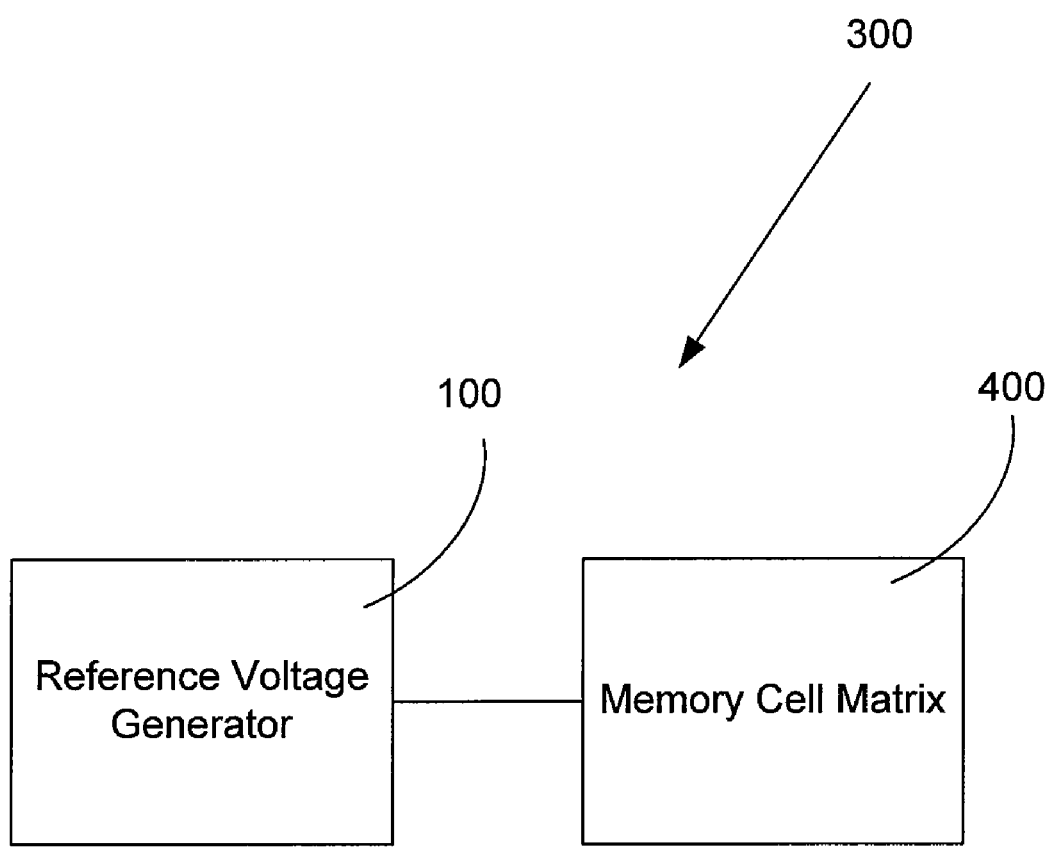
FIG. 5 is a block diagram of a device that includes a voltage generator and a matrix of non-volatile memory cells.

With reference to these drawings, FIG. 2 schematically shows a generator circuit 100 of a reference voltage Vcg, realized according to one embodiment, which can be used for memory semiconductor devices 300 with a non-volatile memory cell matrix 400 (FIG. 5).

The generator circuit 100 comprises a least one reference cell xN having in turn a first conduction terminal 31 connected to a common node 40, a second conduction terminal 32 connected to a first voltage reference V1, in particular a ground, and a control terminal 33 connected to an output terminal Out of the generator circuit 100 itself.

In particular, the reference cell xN, when activated, shows, at the first conduction terminal 31, a current Icell.

According to a preferred embodiment, the generator circuit 100 comprises a plurality of reference cells xN, further preferably a number N equal to sixteen. FIG. 2, by way of simplicity, shows a single one of these reference cells xN.

The generator circuit 100 also comprises a converter or "sense" emulator, globally indicated with SE.

In particular, the converter SE is supplied by a first supply reference, in particular a supply voltage Vdd, and show a first input terminal In1 connected to a first current generator Ig1 suitable for generating a first reference current Iref of constant value. The first current generator Ig1 is interposed between the first voltage reference V1 and a first node 80.

The converter SE shows, moreover, a first output terminal Out1 connected to the common node 40 and a second output terminal Out2.

On the common node 40 there is thus a first voltage Vdrain, generated by the sum of the voltages present on the first output terminal Out1 of the converter means SE and on the first conduction terminal 31 of the reference cell xN. On the second output terminal Out2 of the converter SE there is a second voltage VBL corresponding to the voltage of the first node 80.

The converter SE is substantially a current-voltage converter, which converts current signals into voltage signals, and, preferably by using a current mirror architecture, modifies the first voltage Vdrain present on the common node 40 when the current Icell of the reference cell xN is different from the first reference current Iref of the first current generator Ig1.

The generator circuit 100 further comprises a comparator 12 which is supplied by a second supply reference, in particular a supply overvoltage Vboost and includes a first input terminal In2 connected to the common node 40, a second input terminal In3 connected to the second output terminal Out2 of the converter SE, as well as an output terminal Out3 where the comparator 12 generates a voltage Vout called compared voltage, given by the comparison between a first and a second output voltage, Vdrain and VBL, present on the respective first and second input terminal, In2 and In3.

Suitably, in a preferred embodiment, the second supply reference Vboost has a voltage level higher than the first supply reference Vdd.

Suitably, the output terminal Out3 of the comparator 12 is connected to the output terminal Out of the generator circuit 100.

Preferably, the comparator 12 comprises a transconductance operational amplifier provided with a "High Impedance" input Tai, through which the same operational amplifier is turned off and its output terminal Out3 placed in a high impedance state. Suitably, according to the present embodiment of the generator circuit 100, the operational amplifier has the first input terminal In2 as non-inverting input and the second input terminal In3 as inverting input.

Advantageously, the reference cell xN of the generator circuit 100 comprises a fourth terminal 34, made accessible outside the reference cell xN itself, connected to a first output terminal Out4 of a biasing block 25, in turn controlled by at least one first initialization signal Reset.

In particular, the fourth terminal 34 is a terminal which contacts a floating gate region of the reference cell xN.

Even more in particular, the biasing block 25 is suitable for periodically biasing the floating gate terminal 34 of the reference cell xN on the basis of the first initialization signal Reset.

The biasing block 25 also shows a second output terminal Out5 connected to the third terminal 33 of the reference cell xN and a first input terminal In4 connected to the output terminal Out of the generator circuit 100.

The biasing block 25 comprises at least one first biasing transistor N1 which shows a first conduction terminal 61 connected to the first output terminal Out4, a second conduction terminal 62 connected to a second voltage reference V2, in particular a biasing voltage, and a third control terminal 63 connected to the first initialization signal Reset.

In a preferred embodiment, the biasing voltage V2 is equal to the ground voltage.

Advantageously, the first biasing transistor N1 is driven by the first initialization signal Reset which is suitably timed allowing, periodically, to discharge possible charges contained in the floating gate of the reference cell xN biasing the cell itself at the biasing voltage V2.

The biasing block 25 also comprises a second biasing transistor N2, which shows a first conduction terminal 64 connected to the second output terminal Out5, a second conduction terminal 65 connected to the first voltage reference V1 and a third control terminal 66 connected to the third control terminal 63 of the first biasing transistor N1 and driven by the same first initialization signal Reset.

In particular, the second biasing transistor N2 is advantageously used for periodically biasing the third control terminal 33 of the reference cell xN.

The biasing block 25 also comprises a third transistor N3 interposed between its input terminal In4 and second output terminal Out5, and then the control terminal of the reference cell xN. In particular, the third biasing transistor N3 shows a first conduction terminal 67 connected to the input terminal In4 of the biasing block 25, a second conduction terminal 68 connected to the control terminal 33 of the cell xN and a control terminal 69 suitably driven by a second timed initialization signal NresetLS.

More in particular, the third biasing transistor N3 allows to suitably disconnect the first block 25 from the output terminal Out of the generator circuit 100.

Figure 4:
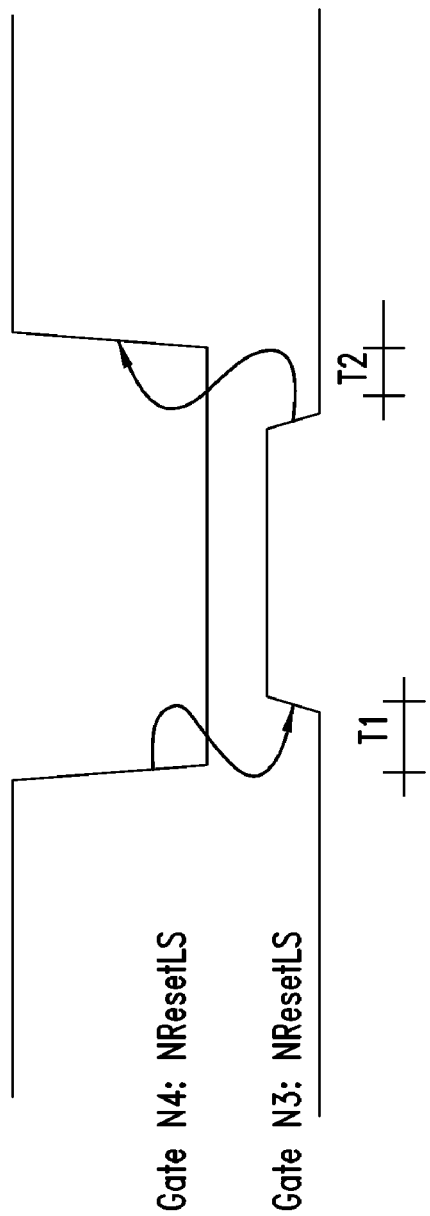
FIG. 4 shows a timing progress of the signals driving a portion of the generator circuits.

FIG. 4 shows the time progresses of the first signal and of the second initialization signal, Reset and NresetLS, suitable for driving the first and the second biasing transistor N1 and N2 and, respectively, the third biasing transistor N3 of the biasing block 25.

The first initialization signal Reset is opposed to the second initialization signal NresetLS and, in particular, the first initialization signal Reset is activated with a delay time T1 with respect to the deactivation of the second initialization signal NresetLS. Moreover, the first initialization signal Reset is deactivated with an advance time T2 with respect to the activation of the second initialization signal NresetLS.

According to a second preferred embodiment, the delay time T1 corresponds to the advance time T2.

Even more in particular, according to the present embodiment, the second initialization signal NResetLS has a voltage value, in correspondence with the highest active level, higher with respect to the first initialization signal Reset and also higher than the first supply voltage Vdd, so as to allow the activation of the third biasing transistor N3. For example, this higher active level of the second initialization signal NresetLS has a value equal to the supply overvoltage Vboost.

Thanks to the particular time progress of the first initialization signal Reset and of the second initialization signal NresetLS, the first and the second biasing transistor, N1 and N2, are activated with a delay equal to the delay time T1 with respect to the deactivation of the third biasing transistor N3, this allows to discharge the charge stored in the floating gate region of the reference cell xN only after the decoupling of the biasing block 25 from the output terminal Out of the generator circuit 100.

In particular, the second biasing transistor N2, when activated, allows to force a null voltage difference between the control terminal 33 and the floating gate terminal 34 of the reference cell xN. Simultaneously, the first biasing transistor N1, when activated, biases the reference cell xN at the predetermined biasing voltage V2.

Subsequently, the first initialization signal Reset is deactivated, the first and the second biasing transistor, N1 and N2, are then deactivated, with a delay equal to the advance time T2 the second initialization signal NresetLS is active and the third biasing transistor N3 thus connects the control terminal 33 of the reference cell xN to the output terminal Out of the generator circuit 100.

In this way, thanks to the biasing block 25, driven by the first initialization signal Reset and by the second initialization signal NresetLS, the reference cell xN is periodically subjected to a biasing step and is biased at the predetermined biasing voltage V2.

Advantageously, moreover, this biasing step is periodically repeated for avoiding that the first conduction terminal 61 of the first biasing transistor N1, if the biasing voltage V2 is null for the known leakage effect, can discharge in an uncontrolled way the reference cell xN. In fact, in this case, the first biasing transistor N1 tends to discharge the reference cell xN after some milliseconds, determining the turn-off thereof.

The circuit 100 comprises a sample and hold block 20 interposed between the output terminal Out3 of the comparator 12 and the output terminal Out of the generator circuit 100. In particular, the sample and hold block 20 allows to maintain the reference voltage Vcg at the output terminal Out of the generator circuit 100 constant and feedback connects the reference cell xN.

Even more in particular, the sample and hold block 20 shows an input terminal In5 connected to the output terminal Out3 of the comparator 12 and an output terminal Out6 connected to the input terminal In4 of the biasing block 25.

The sample and hold block 20 comprises, in particular, a first sample and hold transistor N4 and a second sample and hold transistor N5 suitably connected with a source follower architecture.

The first and the second sample and hold transistors, N4 and N5, have respective first conduction terminals 42, 52 connected to the second supply reference Vboost, as well as control terminals 41, 51 connected to the input terminal In5 of the second sample and hold terminal 20.

Moreover, the first sample and hold transistor N4 has a second conduction terminal 43 connected to the output terminal Out6.

In particular, according to the present embodiment, the second conduction terminal 43 of the first sample and hold transistor N4 is connected to the first conduction terminal 67 of the third biasing transistor N3 of the biasing block 25.

The second transistor N5 shows in turn a second conduction terminal 53 connected to the output terminal Out of the generator circuit 100.

Suitably, the sample and hold block 20 comprises, moreover, a capacitor C interposed between the input terminal In5 and the first voltage reference V1, in particular a ground.

The operational amplifier 12 drives the sample and hold block 20 with the compared voltage Vout supplied onto the output terminal Out3 by the comparator means 12, obtained through comparison between the first output voltage Vdrain and the second output voltage VBL respectively present on the first and second input terminal, In2 and In3, of the comparator 12.

Moreover, the sample and hold block 20, with a source follower architecture, comprises the first and second sample and hold transistor N4 and transistor N5, having substantially identical electric characteristics and thus substantially corresponding voltages present on the second conduction terminals, respectively 43 and 53. In this way, the reference cell xN is feedback biased with a voltage which is substantially equal to the reference voltage Vcg present on the output terminal Out of the generator circuit 100, voltage with which, during a reading step, the cells of the matrix of the memory device are biased.

According to the present embodiment, the first and the second sample and hold transistors, N4 and N5, of the sample and hold block 20 as well as the first, the second and the third biasing transistors, N1, N2 and N3, of the biasing block 25 are of the MOS type, in particular with N channel.

Moreover, in the present embodiment, the current-voltage converter SE is formed by a first circuit branch 92 and by a second circuit branch 93, interposed between the first supply reference Vdd and the first voltage reference V1, in particular the ground. More in particular, the first circuit branch 92 comprises, in series, a first P2 and a second N6 conversion transistor, while the second circuit branch 93 comprises, in series, a third P1 and a fourth N7 conversion transistor.

Suitably, the second transistor N6 and the fourth N7 conversion transistor are mirror-wise connected to respective control terminals 70, 75 connected to each other and to the first node 80.

The second conversion transistor N6 also shows a diode-like configuration with a first conduction terminal 71 connected to its own control terminal 70 and a second conduction terminal 72 connected to the first voltage reference V1. The fourth conversion transistor N7 shows, instead, a first conduction terminal 76 connected to the common node 40 and a second conduction terminal 77 connected to the first voltage reference V1.

Further, the first and the third conversion transistor, P2 and P1, are current mirror connected to each other and show respective first conduction terminals 82, 87 connected to the first reference of al Vdd, second conduction terminals 83, 88 respectively connected to the second and to the fourth conversion transistors, N6 and N7, as well as control terminals 81, 86 connected to each other and to a third voltage reference, in particular a further biasing voltage Vp.

According to the present embodiment, the second transistor and the fourth conversion transistors, N6 and N7, are preferably of the MOS type with N channel, while the first transistor P2 and the third conversion transistor P1 are of the MOS type with P channel and have substantially identical electric characteristics.

As regards the operation, let's hereafter analyze the behavior of the generator circuit 100 when the biasing block 25 has the first initialization signal Reset deactivated and the second initialization signal NresetLS activated.

In particular, the compared voltage Vout present at the output terminal Out3 of the comparator 12, charges the capacitor C of the sample and hold block 20 and biases the first and the second sample and hold transistors, N4 and N5. The voltage present at the output terminal Out6 of the sample and hold block 20 is substantially identical to the reference voltage Vcg present at the output terminal Out of the generator circuit 100. The reference cell xN is thus feedback biased, through the third active biasing transistor N3 of the biasing block 25, with the voltage present at the output terminal Out6 of the sample and hold block 20.

Simultaneously, the converter SE allows to vary the value of the first output voltage Vdrain present on their first output terminal Out1 so that the current Icell of the reference cell xN is identical to the current Iref of the first generator Ig1.

In timed mode, the biasing step switches the first and the second initialization signal, Reset and NresetLS, by deactivating, in particular, the third biasing transistor N3 and activating the first and the second biasing transistor N1 and N2.

According to the present embodiment, it is suitable that the third biasing transistor N3 is deactivated prior to the activation of the first biasing transistor N1 so as to avoid a possible discharge through a circuit branch connected between the second supply reference Vboost and the first voltage reference V1 and comprising the first sample and hold transistor N4, the third biasing transistor N3 and the second biasing transistor N2.

During the biasing step, the reference cell xN is biased by the biasing block 25. In particular, the first biasing transistor N1, by means of the fourth floating gate terminal 34, biases the floating gate region of the reference cell xN at the predetermined biasing voltage V2. In the meantime, the third control terminal 33 of the reference cell xN is biased at the voltage value of the first voltage reference V1, in particular at the ground, by means of the second biasing transistor N2.

Advantageously and simultaneously to the biasing of the reference cell xN, thanks to the capacitor C in the sample and hold block 20, the voltage at the control terminals 41 and 51 respectively of the first and second sample and hold transistors, N4 and N5, is maintained substantially constant. This ensures a constant reference voltage Vcg on the output terminal Out of the generator circuit 100.

It is good to note that if the biasing voltage V2 is placed at a null voltage value there is a complete discharge of the charges contained in the floating gate region of the reference cell xN.

Further, if the reference cell xN is suitably substituted by a buffer of N cells placed in parallel, each cell shows a first conduction terminal 31 connected to the common node 40, a second conduction terminal 32 connected to the first voltage reference V1 and a control terminal 33 connected to the output terminal Out of the generator circuit 100 by the biasing block 25. In this case, the generator circuit 100 shows, moreover, interposed between the second supply reference Vdd and the common node 40, a second constant current generator, shown hereafter with reference to FIG. 3.

Moreover, according to this configuration, the first biasing transistor N1 biases at the predetermined biasing voltage V2 the floating gate regions of each reference cell xN of the buffer, the connection of all the fourth control terminals of the reference cells xN to a single common node connected to the first output terminal Out4 of the biasing block 25 being advantageously possible.

Figure 3:
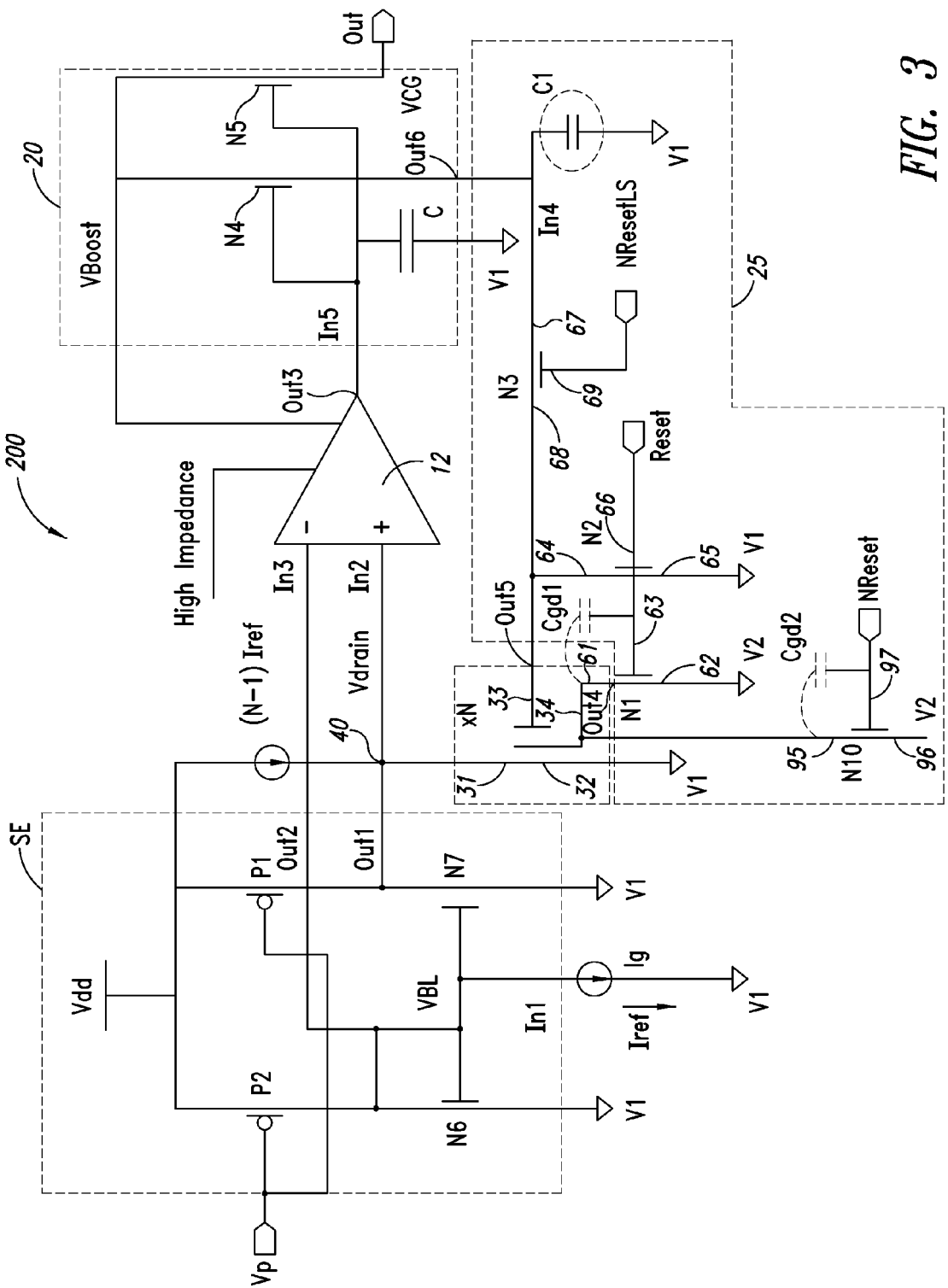
FIG. 3 shows a further embodiment of a generator circuit.

Now, with reference to FIG. 3, a further embodiment of a generator circuit is described, globally indicated with 200, for which details and cooperating parts having the same structure and function will be indicated with the same numbers and reference acronyms.

Advantageously, the generator circuit 200 comprises a biasing block 125 which, with respect to the biasing block 25 previously described, comprises a further fourth biasing transistor N10 connected in parallel to the first biasing transistor N1 with a first conduction terminal 95 connected to the first output terminal Out4 of the biasing block 125, a second conduction terminal 96 connected to the second voltage reference V2, in particular a biasing voltage and a control terminal 97 driven by a third initialization signal Nreset.

In particular, the third initialization signal Nreset is the negative of the first initialization signal Reset and has, preferably, similar voltage levels.

The generator circuit 200 shows, moreover, interposed between the second supply reference Vdd and the common node 40, a second constant current (N−1) IRef generator Ig2, where N is, as previously indicated, the number of reference cells xN.

Advantageously, the first and the fourth biasing transistors, N1 and N10, substantially correspond to each other, and, in particular, respectively show a first parasitic capacitance Cgd1 and a second parasitic capacitance Cg2, between the respective first conduction terminals 61, 95 and the control terminals 63, 97, substantially similar, and even more in particular, active in an alternated way. Suitably, this allows to mutually annul the possible negative effect that each first and second parasitic capacitance, Cg1 and Cg2, has on the reference cell xN.

Further, the first biasing block 125 shows a decoupling capacitor C1 connected between the input terminal In5 of the second sample and hold block 20 and the first voltage reference V1. Suitably, the decoupling capacitor C1 allows to filter possible parasitic disturbances during the operation of the first biasing block 125.

An advantage of the generator circuits 100, 200 is that of ensuring a biasing at a predetermined reference voltage for each reference cell xN of the circuit itself, periodically and repeatedly without the use of ultraviolet rays. This is made possible thanks to the presence of floating gate terminals of the reference cells accessible outside which are periodically biased by means of the first biasing block at the predetermined biasing voltage V2.

Another advantage is given by the fact that the biasing of the reference cell xN occurs independently from the sizes of the cell itself. In fact, in the case of more reference cells xN in parallel, all the fourth control terminals are connected to a single common node and connected to the first output terminal of the first biasing block.

A further advantage is linked to the presence in the biasing block of the second biasing transistor which allows to dampen at the third control terminal of the reference cells xN possible leakage effects due to the first biasing transistor.

Another advantage is that the reference cell or cells xN are biased at the reference voltage Vcg present at the output terminal Out of the circuit itself, the voltage with which the matrix cells are biased, thus allowing the reference cells xN can constantly follow the behavior of the matrix cells.

Further, the particular source follower conformation of the sample and hold block comprised in the generator circuit allows to drive a plurality of cells of the matrix avoiding the presence at the output terminal Out of the circuit itself of a filter capacitor of particularly high level. This allows the generator circuit to reduce the occupied area resulting to be more compact and also to be obtained at reduced costs.

A further advantage of the present generator circuit are the reduced realization times, in fact the presence of the first biasing block allows to reduce the productive steps avoiding the use of ultraviolet rays UV for the complete erasing of the reference cell or cells.

One embodiment is a method for generating a reference voltage in semiconductor memory devices with matrixes of non-volatile cells, using a generator circuit as previously described for which details and cooperating parts having the same structure and function will be indicated with the same numbers and reference acronyms.

The method provides the steps of:
activating said at least one reference cell xN for generating a current Icell on the first conduction terminal 31 of the cell itself;
activating the converter SE to supply on its first output terminal Out1 and then on the common node 40, a first voltage output value Vdrain and on its second output terminal Out2 a second output voltage value VBL;
activating the comparator 12 to supply its output terminal Out3 with a compared voltage value Vout, obtained through comparison between the first Vdrain and the second output voltage VBL of the converter SE;
feedback driving the reference cell xN supplying its third control terminal 33 with at least one portion of said compared voltage Vout.

Advantageously, the method provides:
externally contacting, by a fourth terminal 34, the floating gate region of the reference cell xN;
connecting the fourth terminal 34 of the reference cell xN to a first output terminal Out4 of a first biasing block of the generator circuit.

Suitably, the method provides a periodical biasing step based on a first initialization signal Reset of the floating gate region of the reference cell xN, periodically controlling the first biasing block by means of the first initialization signal Reset.

The method also provides to drive the control terminal 63 of the first biasing transistor N1 by means of the first initialization signal Resete and then to activate this first biasing transistor N1 in a timed way.

The method provides, in a preferred embodiment, that the second voltage reference V2, in particular the biasing voltage, is a ground.

Suitably, the method also provides to drive the control terminal 66 of the second biasing transistor N2 by means of the first signal Reset.

The method also provides to feedback control with at least one portion of the reference voltage Vcg the third control terminal 33 of the reference cell xN.

Suitably, the method provides to drive the control terminal of the third transistor N3 with a second timed signal NresetLS.

Advantageously, moreover, the method provides that the second initialization signal NresetLS is the negative of the first initialization signal Reset.

Suitably, the method further provides to activate the first initialization signal Reset with a delay time T1 with respect to the deactivation of the second initialization signal NresetLS as well as to deactivate the first initialization signal Reset with an advance time T2 with respect to the activation of the second initialization signal NresetLS, as shown in FIG. 4. Preferably, moreover, the method provides a high voltage level for the second initialization signal NresetLS higher than a voltage high level for the first initialization signal Reset.

Further, preferably, this higher active level of the second initialization signal NresetLS has a value identical to the supply overvoltage Vboost.

In this way, the method allows to activate the first and the second biasing transistors, N1 and N2, when the third biasing transistor N3 is off, avoiding the formation of possible circuit discharge branches towards the first voltage reference V1, as it will be better explained hereafter.

Suitably, in a preferred embodiment, the second supply voltage Vboost has a voltage level higher than the first supply voltage Vdd.

The suitable switch, provided by the method, of the first initialization signal Reset and of the second initialization signal NresetLS avoids a possible discharge branch made by the first sample and hold transistor N4, by the third biasing transistor N3 and by the second biasing transistor N2 between the second supply reference Vboost and the first voltage reference V1.

Advantageously, the biasing step of the method provides to:
charge the capacitor C of the sample and hold block 20 at the value of the compared voltage Vout supplied by the comparator 12;
deactivate the comparator 12;
deactivate the third biasing transistor N3 of the first biasing block using the second initialization signal NresetLS activating, in sequence, with a delay equal to the delay time T1, the first initialization signal Reset and, in consequence, the first and the second biasing transistors, N1 and N2, for allowing the biasing of the floating gate region of the reference cell xN at the value of the second voltage reference V2, i.e., of the predetermined biasing voltage.

The biasing step further provides to deactivate the first and the second biasing transistors, N1 and N2, with the deactivation of the first initialization signal Reset and to activate— after a delay equal to the advance time T2—the third biasing transistor N3.

The method then provides to cyclically repeat the biasing step at timed intervals.

The method further provides a step of holding in voltage the output terminal Out using the sample and hold block 20, and in particular the capacitor C connected between the output terminal Out3 of the comparator 12 and the first voltage reference V1.

The method, using the embodiment shown in FIG. 3, also provides a driving step of the fourth biasing transistor N10 using the third initialization signal Nreset, suitably opposed to the first initialization signal Reset with corresponding voltage levels.

In particular, the first biasing transistor N1 is thus activated when the fourth biasing transistor N10 is deactivated.

An advantage of the method is the simplicity and the efficiency with which it is possible, in a cyclical and repeated way, to bring the reference cell xN back to the predetermined biasing voltage V2, biasing with the first biasing block the floating gate region of the reference cell xN.

A further advantage is linked to the fact that in case the predetermined biasing voltage V2 is null, the method allows to cyclically and repeatedly bring the reference cell xN back to the "virgin" condition, without resorting to the use of the ultraviolet rays. Moreover, the method allows to bring back to the "virgin" condition the reference cell xN completely independently from the physical dimensions of the cell itself.

A further great advantage of the method is due to the fact that the method allows, during the biasing step of the reference cell xN, to maintain the reference voltage Vcg at the output terminal Out of the circuit itself, constant. In this way the memory cells of the matrix associated with the generator circuit are not affected by the biasing step of the reference cell xN, thus obtaining a more efficient circuit, without pending times.

In case the circuit includes more reference cells in parallel, the method provides to connect the respective fourth control terminals of these cells to the first conduction terminal 61 of the first biasing transistor N1 and thus provides to realize the biasing step simultaneously on said reference cells. The method provides to cyclically and periodically repeat this biasing step on the basis of the timing of the first initialization step Reset.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A generator circuit, comprising:
a generator circuit output terminal for connection to a matrix of non-volatile memory cells;
a converter structured for coupling to a first supply reference and having a first output terminal, coupled to a common node, and a second output terminal;
a comparator structured for coupling to a second supply reference and positioned between said common node and said generator circuit output terminal, said comparator having first and second input terminals and an output terminal, the first and second input terminals being respectively connected to said first and second output terminals of said converter, the comparator being configured to supply, at the output terminal of the comparator, a compared voltage given by a comparison between first and second voltage values present on said first and second input terminals, respectively;
a reference cell positioned between said common node and a first voltage reference terminal, said reference cell including a control gate and a floating gate with a contact terminal; and
a biasing block having an input terminal and first and second output terminals, the first output terminal of the biasing block being coupled to the control gate, the second output terminal of the biasing block being coupled to the contact terminal, and the input terminal of the biasing block being coupled to said output terminal of said generator circuit, the biasing block being structured to periodically bias said floating gate contact terminal at a biasing voltage of a second voltage reference terminal.

2. A generator circuit, comprising:
a generator circuit output terminal for connection to a matrix of non-volatile memory cells;
a converter structured for coupling to a first supply reference and having a first output terminal, coupled to a common node, and a second output terminal;
a comparator structured for coupling to a second supply reference and positioned between said common node and said generator circuit output terminal, said comparator having first and second input terminals and an output terminal, the first and second input terminals being respectively connected to said first and second output terminals of said converter, the comparator being configured to supply, at the output terminal of the comparator, a compared voltage given by a comparison between first and second voltage values present on said first and second input terminals, respectively;
a reference cell positioned between said common node and a first voltage reference terminal, said reference cell including a floating gate with a contact terminal; and
a biasing block coupled to the contact terminal, said biasing block having an input terminal coupled to said output terminal of said generator circuit, and being structured to periodically bias said floating gate contact terminal at a biasing voltage of a second voltage reference terminal, wherein said biasing block comprises a first biasing transistor having a first conduction terminal coupled to said floating gate contact terminal in correspondence with a first output terminal of said biasing block, a second conduction terminal coupled to said second voltage reference terminal, and a control terminal configured to be driven by a first initialization signal for periodically biasing said floating gate contact terminal.

3. A generator circuit according to claim 2, wherein said biasing block further comprises a second biasing transistor positioned between a control gate of said reference cell, corresponding to a second output terminal of said first biasing block, and said first voltage reference terminal, the second biasing transistor having a control terminal configured to be driven by said first initialization signal.

4. A generator circuit according to claim 3, wherein the biasing block comprises a third biasing transistor having a first conduction terminal connected to said input terminal of said biasing block, a second conduction terminal connected to said second output terminal of said first biasing block, and a control terminal configured to be driven by a second initialization signal.

5. A generator circuit according to claim 4, wherein said second initialization signal is opposed to said first initialization signal.

6. A generator circuit according to claim 4, wherein said second initialization signal has a voltage having a highest active level, that is higher than said first initialization signal and also higher than said first supply reference, so as to allow the activation of said third biasing transistor of said biasing block.

7. A generator circuit according to claim 6, wherein said second initialization signal has a voltage having a highest active level equal to said second supply reference.

8. A generator circuit according to claim 7, wherein said first initialization signal is activated with a delay time with respect to a deactivation of said second initialization signal and is deactivated with an advance time with respect to the activation of said second initialization signal.

9. A generator circuit according to claim 4, further comprising a sample and hold block positioned between the output terminal of said comparator and said output terminal of said generator circuit, the sample and hold block being configured to be supplied by said second supply reference and having an output terminal coupled to said input terminal of said biasing block.

10. A generator circuit according to claim 9, wherein said sample and hold block comprises:
first and second sample and hold transistors connected in source follower configuration and positioned in cascade with said output terminal of said comparator and said output terminal of said generator circuit; and
a capacitance positioned between said output terminal of said comparator and said first voltage reference.

11. A generator circuit according to claim 10, wherein said first and second sample and hold transistors have respective control terminals coupled to said output terminal of said comparator, first conduction terminals configured for coupling to said second supply reference, and second conduction terminals coupled respectively to said output terminal of the sample and hold circuit and to said output terminal of said generator circuit.

12. A generator circuit, comprising:
a generator circuit output terminal for connection to a matrix of non-volatile memory cells;
a converter structured for coupling to a first supply reference and having a first output terminal, coupled to a common node, and a second output terminal;
a comparator structured for coupling to a second supply reference and positioned between said common node and said generator circuit output terminal, said comparator having first and second input terminals and an output terminal, the first and second input terminals being respectively connected to said first and second output terminals of said converter, the comparator being configured to supply, at the output terminal of the comparator, a compared voltage given by a comparison between first and second voltage values present on said first and second input terminals, respectively;
a reference cell positioned between said common node and a first voltage reference terminal, said reference cell including a floating gate with a contact terminal;
a biasing block coupled to the contact terminal, said biasing block having an input terminal coupled to said output terminal of said generator circuit, and being structured to periodically bias said floating gate contact terminal at a biasing voltage of a second voltage reference terminal, wherein the reference cell is one of a plurality of reference cells placed in parallel, each reference cell having a first conduction terminal coupled to said common node, the generator circuit further comprising a current generator positioned between said first supply reference and said common node, said second generator supplying a current (N−1)*Iref, N being the number of cells of said plurality of reference cells and Iref a reference current value supplied to said converter.

13. A generator circuit according to claim 2 wherein said biasing block comprises a second biasing transistor having a first conduction terminal coupled to said first output terminal of said biasing block, a second conduction terminal coupled to said second voltage reference terminal, and a control terminal configured to be driven by a second initialization signal.

14. A generator circuit according to claim 13, wherein said second initialization signal is opposed to said first initialization signal.

15. A generator circuit, comprising:
a generator circuit output terminal for connection to a matrix of non-volatile memory cells;
a converter structured for coupling to a first supply reference and having a first output terminal, coupled to a common node, and a second output terminal;
a comparator structured for coupling to a second supply reference and positioned between said common node and said generator circuit output terminal, said comparator having first and second input terminals and an output terminal, the first and second input terminals being respectively connected to said first and second output terminals of said converter, the comparator being configured to supply, at the output terminal of the comparator, a compared voltage given by a comparison between first and second voltage values present on said first and second input terminals, respectively;
a reference cell positioned between said common node and a first voltage reference terminal, said reference cell including a floating gate with a contact terminal;
a biasing block coupled to the contact terminal, said biasing block having an input terminal coupled to said output terminal of said generator circuit, and being structured to periodically bias said floating gate contact terminal at a biasing voltage of a second voltage reference terminal wherein said biasing block comprises a decoupling capacitance coupled between said input terminal of said biasing block and said first voltage reference terminal.

16. A generator circuit according to claim 1 wherein said first voltage reference terminal is a ground.

17. A generator circuit according to claim 1 wherein said second voltage reference terminal is a ground.

18. The generator circuit, comprising:
a generator circuit output terminal;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the biasing block comprises a biasing transistor having a first conduction terminal coupled to the floating gate contact terminal, a second conduction terminal coupled to a second voltage reference terminal, and a control terminal configured to be driven by an initialization signal for periodically biasing the floating gate contact terminal.

19. The generator circuit, comprising:
a generator circuit output terminal;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the biasing block comprises a biasing transistor positioned between a control gate of the reference cell, and the first voltage reference terminal, the biasing transistor having a control terminal configured to be driven by the initialization signal.

20. The generator circuit, comprising:
a generator circuit output terminal;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the biasing block comprises a biasing transistor having a first conduction terminal coupled to the input terminal of the biasing block, a second conduction terminal coupled to a control gate of the reference cell, and a control terminal configured to be driven by an initialization signal.

21. The generator circuit, comprising:
a generator circuit output terminal;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal;
a biasing block coupled to the contact terminal, the biasing block having an input terminal coupled to the generator circuit output terminal, and being structured to periodically bias the floating gate contact terminal at a biasing voltage; and
a sample and hold block positioned between the output terminal of the comparator and the output terminal of the generator circuit, the sample and hold block having an output terminal coupled to the input terminal of the biasing block.

22. The generator circuit of claim 21, wherein the sample and hold block comprises:
first and second sample and hold transistors connected in source follower configuration and positioned in cascade with the output terminal of the comparator and the output terminal of the generator circuit; and
a capacitance positioned between the output terminal of the comparator and the first voltage reference.

23. The generator circuit of claim 21, wherein the first and second sample and hold transistors have respective control terminals coupled to the output terminal of the comparator, first conduction terminals configured for coupling to the second supply reference, and second conduction terminals coupled respectively to the output terminal of the sample and hold circuit and to the output terminal of the generator circuit.

24. The generator circuit, comprising:
a generator circuit output terminal;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the reference cell is one of a plurality of reference cells placed in parallel, each reference cell having a first conduction terminal coupled to the common node, the generator circuit further comprising a current generator positioned between the first supply reference and the common node, the second generator supplying a current (N−1)*Iref, N being the number of cells of the plurality of reference cells and Iref a reference current value.

25. A device, comprising:
a matrix of non-volatile memory cells; and
generator circuit that includes:
a generator circuit output terminal coupled to the matrix;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the biasing block comprises a biasing transistor having a first conduction terminal coupled to the floating gate contact terminal, a second conduction terminal coupled to a second voltage reference terminal, and a control terminal configured to be driven by an initialization signal for periodically biasing the floating gate contact terminal.

26. A device, comprising:
a matrix of non-volatile memory cells; and
generator circuit that includes:
a generator circuit output terminal coupled to the matrix;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the biasing block comprises a biasing transistor positioned between a control terminal of the reference cell, and the first voltage reference terminal, the biasing transistor having a control terminal configured to be driven by the initialization signal.

27. A device, comprising:
a matrix of non-volatile memory cells; and
generator circuit that includes:
a generator circuit output terminal coupled to the matrix;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the biasing block comprises a biasing transistor having a first conduction terminal coupled to the input terminal of the biasing block, a second conduction terminal coupled to a control terminal of the reference cell, and a control terminal configured to be driven by an initialization signal.

28. A device, comprising:
a matrix of non-volatile memory cells; and
generator circuit that includes:
a generator circuit output terminal coupled to the matrix;
a comparator positioned between a common node and the output terminal, the comparator having first and second input terminals and an output terminal suitable for supplying a compared voltage given by a comparison between first and second voltage values present on the first and second input terminals, respectively;
a reference cell positioned between the common node and a first voltage reference terminal, the reference cell including a floating gate with a contact terminal; and
a biasing block coupled to the contact terminal, the biasing block having an input terminal coupled to the generator circuit output terminal, and being structured to periodically bias the floating gate contact terminal at a biasing voltage, wherein the generator circuit includes a sample and hold block positioned between the output terminal of the comparator and the output terminal of the generator circuit, the sample and hold block having an output terminal coupled to the input terminal of the biasing block.

29. The device of claim 28, wherein the sample and hold block comprises:
first and second sample and hold transistors connected in source follower configuration and positioned in cascade with the output terminal of the comparator and the output terminal of the generator circuit; and a capacitance positioned between the output terminal of the comparator and the first voltage reference.

30. The device of claim 28, wherein the first and second sample and hold transistors have respective control terminals coupled to the output terminal of the comparator, first conduction terminals configured for coupling to the second supply reference, and second conduction terminals coupled respectively to the output terminal of the sample and hold circuit and to the output terminal of the generator circuit.

31. A device, comprising:

a matrix of non-volatile memory cells; and generator circuit that includes:

a generator circuit output terminal coupled to the matrix;

a comparator positioned between a common node and the output terminal, the comparator having first and second input terminals and an output terminal suitable for supplying a compared voltage given by a comparison between first and second voltage values present on the first and second input terminals, respectively;

a reference cell positioned between the common node and a first voltage reference terminal, the reference cell including a floating gate with a contact terminal; and a biasing block coupled to the contact terminal, the biasing block having an input terminal coupled to the generator circuit output terminal, and being structured to periodically bias the floating gate contact terminal at a biasing voltage, wherein the reference cell is one of a plurality of reference cells placed in parallel, each reference cell having a first conduction terminal coupled to the common node, the generator circuit further comprising a current generator positioned between the first supply reference and the common node, the second generator supplying a current $(N-1)*Iref$, N being the number of cells of the plurality of reference cells and Iref a reference current value.

* * * * *